United States Patent
Umetsu et al.

(10) Patent No.: US 7,624,661 B2
(45) Date of Patent: Dec. 1, 2009

(54) SUPPORTING UNIT, AND MOVING TABLE DEVICE AND LINEAR-MOTION GUIDING DEVICE THAT USE THE SUPPORTING UNIT

(75) Inventors: Shigehiro Umetsu, Yonezawa (JP); Tatsuro Shimoyama, Komaki (JP); Koji Uchida, Komaki (JP)

(73) Assignees: CKD Corporation, Aichi (JP); Tohoku Pioneer Corporation, Yamagata (JP)

( * ) Notice: Subject to any disclaimer, the term of this patent is extended or adjusted under 35 U.S.C. 154(b) by 636 days.

(21) Appl. No.: 10/558,686

(22) PCT Filed: Jun. 25, 2004

(86) PCT No.: PCT/JP2004/009401

§ 371 (c)(1),
(2), (4) Date: Dec. 27, 2005

(87) PCT Pub. No.: WO2005/001844

PCT Pub. Date: Jan. 6, 2005

(65) Prior Publication Data

US 2006/0248977 A1 Nov. 9, 2006

(30) Foreign Application Priority Data

Jun. 27, 2003 (JP) ............................. 2003-184463

(51) Int. Cl.
*G05G 11/00* (2006.01)
(52) U.S. Cl. .................... 74/490.08; 74/490.09; 384/9; 384/12; 384/206
(58) Field of Classification Search ............. 74/490.08, 74/490.09; 384/9, 12, 192, 206; 403/122–144
See application file for complete search history.

(56) References Cited

U.S. PATENT DOCUMENTS

| 3,834,727 | A | * | 9/1974 | Adams | ................... 280/93.511 |
| 5,524,502 | A | | 6/1996 | Osanai | |
| 5,716,143 | A | * | 2/1998 | Browne et al. | ............... 384/192 |
| 5,762,424 | A | * | 6/1998 | Harris et al. | ................. 384/299 |
| 5,915,842 | A | * | 6/1999 | Redinger | ..................... 384/203 |
| 6,149,506 | A | * | 11/2000 | Duescher | ..................... 451/59 |
| 6,510,755 | B1 | | 1/2003 | Higuchi et al. | |
| 7,306,374 | B2 | * | 12/2007 | Hokkirigawa et al. | ........ 384/297 |
| 2002/0074516 | A1 | | 6/2002 | Novak et al. | |

(Continued)

FOREIGN PATENT DOCUMENTS

JP A 64-071640 3/1989

(Continued)

*Primary Examiner*—David M Fenstermacher
(74) *Attorney, Agent, or Firm*—Oliff & Berridge, PLC

(57) ABSTRACT

A supporting unit in a moving table device, easily connected to a base and a table, is provided. A supporting unit (Uα) has a pair of planar bearing plates. Inside the planar bearing plates are positioned spherical bearing plates, respectively. Further, a spherical axial member is sandwiched between the spherical bearing plates (34a, 34b). A planar bearing is formed between each of the planar bearing plates and each of the spherical bearing plates. A spherical bearing is formed between each of the spherical bearing plates and the spherical axial member. Thus, the supporting unit (Uα) is provided with a certain degree of movability in five-axis directions. With the high degree of movability, the supporting unit (Uα) can be easily connected to a base and a table.

10 Claims, 10 Drawing Sheets

U.S. PATENT DOCUMENTS

| | | |
|---|---|---|
| 2002/0075467 A1 | 6/2002 | Tanaka et al. |
| 2003/0223887 A1* | 12/2003 | Kawano et al. .............. 417/269 |
| 2005/0155489 A1* | 7/2005 | Petersen et al. ................ 92/157 |
| 2009/0007773 A1* | 1/2009 | Zhu ........................... 91/505 |

FOREIGN PATENT DOCUMENTS

| | | |
|---|---|---|
| JP | A-1-314994 | 12/1989 |
| JP | A 05-209664 | 8/1993 |
| JP | B 2700050 | 9/1997 |
| JP | A 2002-0098784 | 4/2002 |

\* cited by examiner (a)

(b)

(a)

(b)

(a)

(b)

(a)

(b)

SUPPORTING UNIT, AND MOVING TABLE DEVICE AND LINEAR-MOTION GUIDING DEVICE THAT USE THE SUPPORTING UNIT

TECHNICAL FIELD

The present invention relates to a moving table device used in, such as precision measurement systems, precision assembly systems, semiconductor manufacturing systems, and a supporting unit for use in the device.

BACKGROUND ART

In recent years, alignment accuracy of 0.1 μm or higher is required in integrated semiconductor circuits, in order to achieve a line width of between 0.25 and 0.3 μm. To achieve such high-accuracy positioning, a moving table device is utilized in semiconductor manufacturing systems. High-accuracy positioning is also required in precision measurement systems and precision assembly systems, and a moving table device is utilized in these systems as well.

One type of known conventional moving table devices is the so-called X-Y-θ table. In the general configuration of the X-Y-θ table, three movable mechanisms, one each of which moves in the X Y, and θ axial directions respectively, are stacked on a base and support a table that is placed on top.

However, the configuration in which movable mechanisms in the X, Y, and θ axial directions are stacked has various problems such as: the large number of components required; instability resulting from the tall height from the base to the table; the decreased accuracy in the upper mechanism(s) successively caused by the effects of the moving mechanism(s) below; difficulty in ensuring accuracy when combining the three moving mechanisms of the X, Y, and θ axial directions; and the damage and failure caused by the movements of the cables for the mechanisms of the X, Y, and θ directions.

To solve such problems, Japanese Patent No. 2700050, for example, suggests an apparatus which has a supporting unit comprised of a pair of linear-motion guiding bearings, each of which consists of a guiding part and a movable part, and which both of movable parts are rotatably linked to each other, a base linked to one of the guiding parts of the linear-motion guiding bearings; and a table linked to the other guiding part.

However, in this conventional supporting unit, the movable parts are linked to each other, and the guiding parts only allow the movable parts to move in the guided direction. As a result, this configuration only allows the movable parts to rotate in the forward or reverse direction and to move along the individual guiding parts, while the guiding parts are fixed. Consequently, it is not possible to correctly install the supporting unit unless the base and the table are held in an almost perfectly parallel relationship to each other (specifically, at an accuracy of 0.05 μm or higher), complicating the installation of the supporting unit. Worse yet, forcibly installing the supporting unit can deform the bearing, preventing smooth operations.

Another type of apparatus that has the same kinds of problems is the linear-motion guiding device. In one type of known linear-motion guiding device, a slider is linearly moved along a guide block. To drive the slider, a drive mechanism that uses a ball screw and a ball nut is provided and is linked to the slider via a supporting unit. Such a linear-motion guiding device encounters the same problems as those described above during the installation of the supporting unit.

The present invention has been conceived in view of the aforementioned situation, and an objective is to provide a supporting unit that can be easily installed without the risk of bearing deformation, as well as a moving table device and a linear-motion guiding device that use the supporting unit

DISCLOSURE OF INVENTION

One of the supporting units related to the present invention may have the following configuration. This supporting unit can be installed on a first counterpart and a second counterpart, and can support the second counterpart for the first counterpart. This supporting unit may be provided with a first installation member to be installed in the first counterpart and a second installation member to be installed in the second counterpart In this supporting unit, the first installation member and the second installation member may be installed via a bearing structure. This bearing structure ensures the movability along all of the six axes except for one linear axis, which six axes are comprised of linear axes in the X, Y, and Z directions that are mutually orthogonal to each other and the rotational axes in the rotational direction of the linear axes.

According to such a configuration, the movability along each five out of the total six axes is ensured between the first installation member and the second installation member. Therefore, when this configuration is to be applied to a moving table device, specifically, for example, when linking the second installation member to the table while the first installation member is linked to the linear actuator of the base, even if the positional accuracy among these members is insufficient, the aforementioned high degree of the movability can compensate for the insufficient positional accuracy, thus facilitating the linking of the supporting unit. Likewise, when the supporting unit is to be applied to a linear-motion guiding device, specifically, for example, when linking the second installation member to a slider while the first installation member is linked to a drive mechanism, even if the positional accuracy among these members is insufficient, the aforementioned high degree of the movability can compensate for the insufficient positional accuracy, thus facilitating the linking of the supporting unit as a joint.

In the supporting unit, the bearing structure that ensures the movability along all the axes except one linear axis can be achieved by combining a spherical bearing with a planar bearing. It can also be achieved by combining a spherical bearing and a first linear bearing with a second linear bearing that is orthogonal to the first linear bearing.

To apply the supporting unit to a moving table device in which a table is moved and rotated relative to a base, either the first or second installation member of each supporting unit may be linked to a linear actuator provided on the base and the other installation member may be linked to the table. In this case, it is preferable to provide the base with a table bearing for supporting the load from the table. In conventional devices, the supporting unit itself supported the load from the table. However, since the supporting unit has multiple movable parts, its support rigidity cannot be considered to be high. Therefore, providing a dedicated bearing that is separate from the supporting unit improves support rigidity and eliminates excessive load on the supporting unit.

In this case, it is even more preferable to use a static pressure bearing as the table bearing. In this configuration, the table can be kept out of contact with the base by supplying a compressed gas to this static pressure bearing while the table can be held on the base by suctioning off the gas via the static pressure bearing. With such a configuration, after the positional adjustment of the table involving its movement and rotation, the table is held on the base. Therefore, when work must be performed on the table, the table will not vibrate, enabling highly accurate work.

In another application example, the supporting unit can be applied to a linear-motion guiding device. That is, the supporting unit can be applied to a linear-motion guiding device that may be provided with a guiding member, a slider mounted on the guiding member that is movable in the linear direction along the guiding member, and a driving mechanism that drives the slider. In this case, either the first or second installation member of the supporting unit, may be linked to the driving mechanism while the other installation member may be linked to the slider. Thus, the single linear axis, along which movability is restricted by these links, is positioned to match the linear movement direction of the slider. With such a configuration, the supporting unit can be installed without any difficulties and without the risk of bearing deformation, even if the guided direction provided by the guiding member is not exactly parallel to the slider feeding direction of the driving mechanism.

A first embodiment of the supporting unit can be provided with an axial member, a pair of first bearing members positioned to sandwich the axial member, and a pair of second bearing members positioned to externally sandwich the first bearing members. In this supporting unit, the first bearing members may be provided with first bearings that support the axial member, and either the first bearing members or the second bearing members may be provided with second bearings that support the first bearing members. Either both of the first bearings, or both of the second bearings can be configured as spherical bearings, and the other two bearings can be configured as planar bearings.

Such a configuration, when viewed in terms of the relationship between the second bearing member and the axial member, ensures the movability of the planar bearings in the planar direction and the rotational movability based on the spherical bearings. Therefore, when applying this configuration to a moving table device, specifically, for example, when linking the second bearing member to the table while the axial member is linked to the linear actuator of the base, even if the positional accuracy among these members is insufficient, the aforementioned high degree of the movability can compensate for the insufficient positional accuracy, thus facilitating the linking of the supporting unit.

In the supporting unit shown as the first embodiment, it is preferable to provide a linking member for linking together both of the second bearing members. Lining them with a linking member can secure the positional relationship between both of the second bearing members using only the supporting unit. Moreover, in this case, it is preferable to provide a pair of the linking members to form, together with both of the second bearing members, a frame shape, and to position the first bearing members and the axial member inside this frame.

Furthermore, it is preferable to use static pressure bearings for both the first bearing and second bearing. This configuration can improve the bearing accuracy. Also, in this case, it is more preferable to provide the first bearing member with an induction port for inducing the compressed gas to be emitted from the second bearing into the first bearing. In this configuration, the first bearing and the second bearing can share the same flow channel for receiving the compressed gas from the outside, thus the flow channel structure can be simplified.

A second embodiment of the supporting unit can be provided with an installation shaft, a first bearing member positioned to surround the installation shaft, a pair of second bearing members positioned to sandwich the first bearing member, and a pair of third bearing members positioned to externally sandwich the second bearing members. In this supporting unit, the first bearing member may be provided with a first bearing that supports the installation shaft, the second bearing members may be provided with second bearings that support the first bearing member, and either the second bearing members or the third bearing members may be provided with third bearings that support the second bearings. The first bearing can be configured as a linear bearing that guides the movement in the axial direction of the installation shaft, either both of the second bearings or both of the third bearings can be configured as spherical bearings, and the other two bearings can be configured as linear bearings that guide the movement in the direction that is perpendicular to the axial direction.

Such a configuration, when viewed in terms of the relationship between the installation shaft and the third bearing members, ensures the movability in the planar direction based on a pair of mutually orthogonal linear bearings, as well as the rotational movability based on the spherical bearings.

BEST MODE FOR CARRYING OUT THE INVENTION

Figure 1:
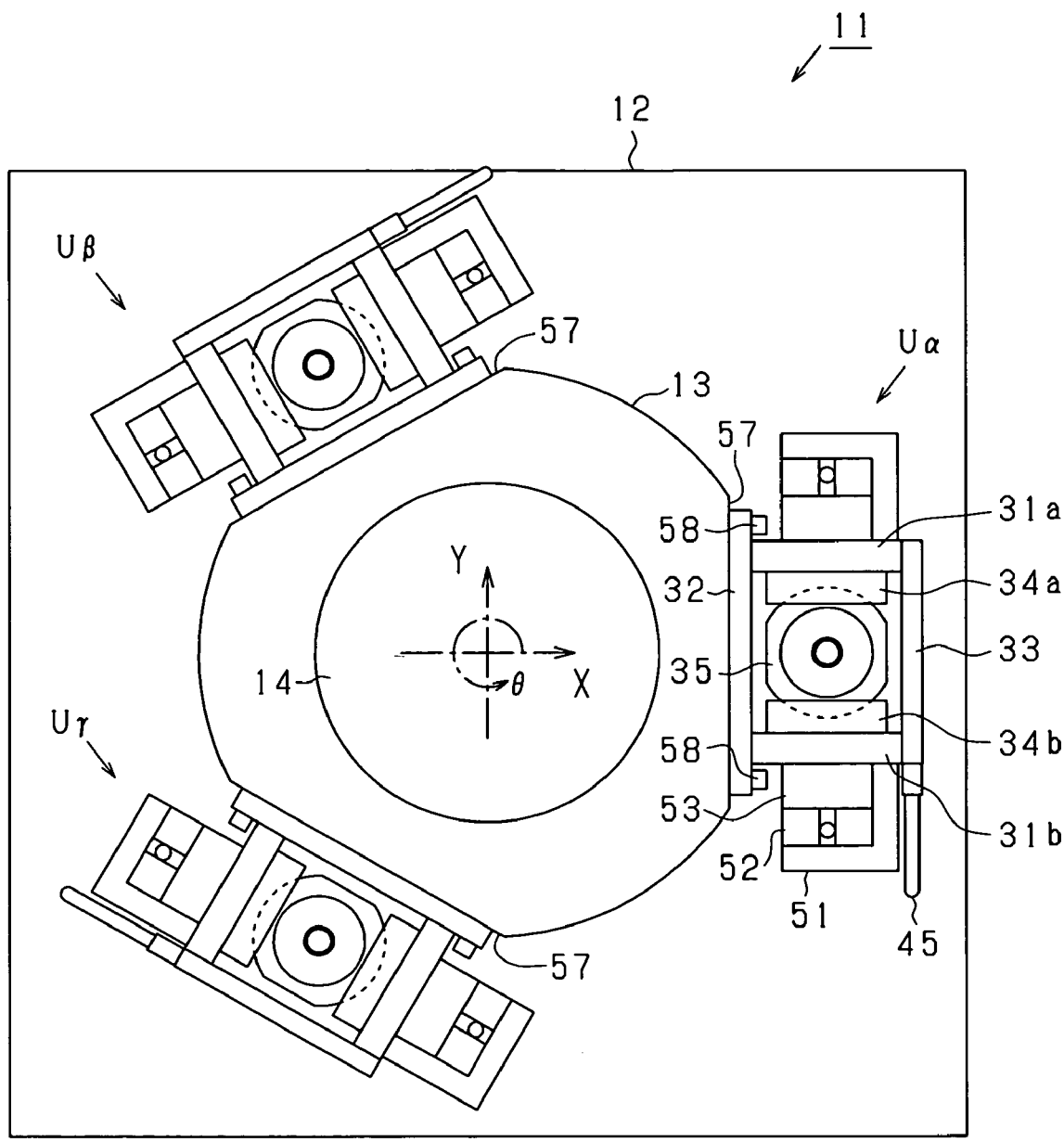
FIG. 1 is a plan view of a moving table device in an embodiment
Figure 2:
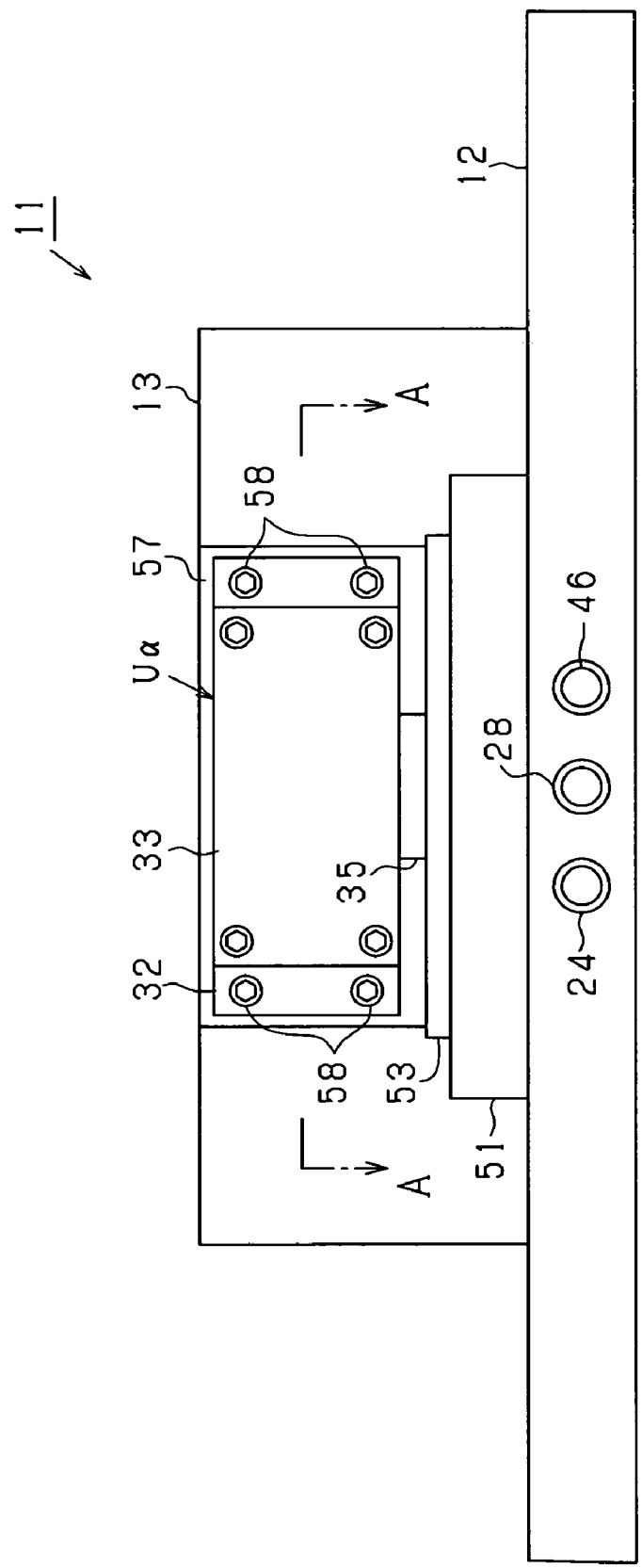
FIG. 2 is a side view of the moving table device in the embodiment
Figure 3:
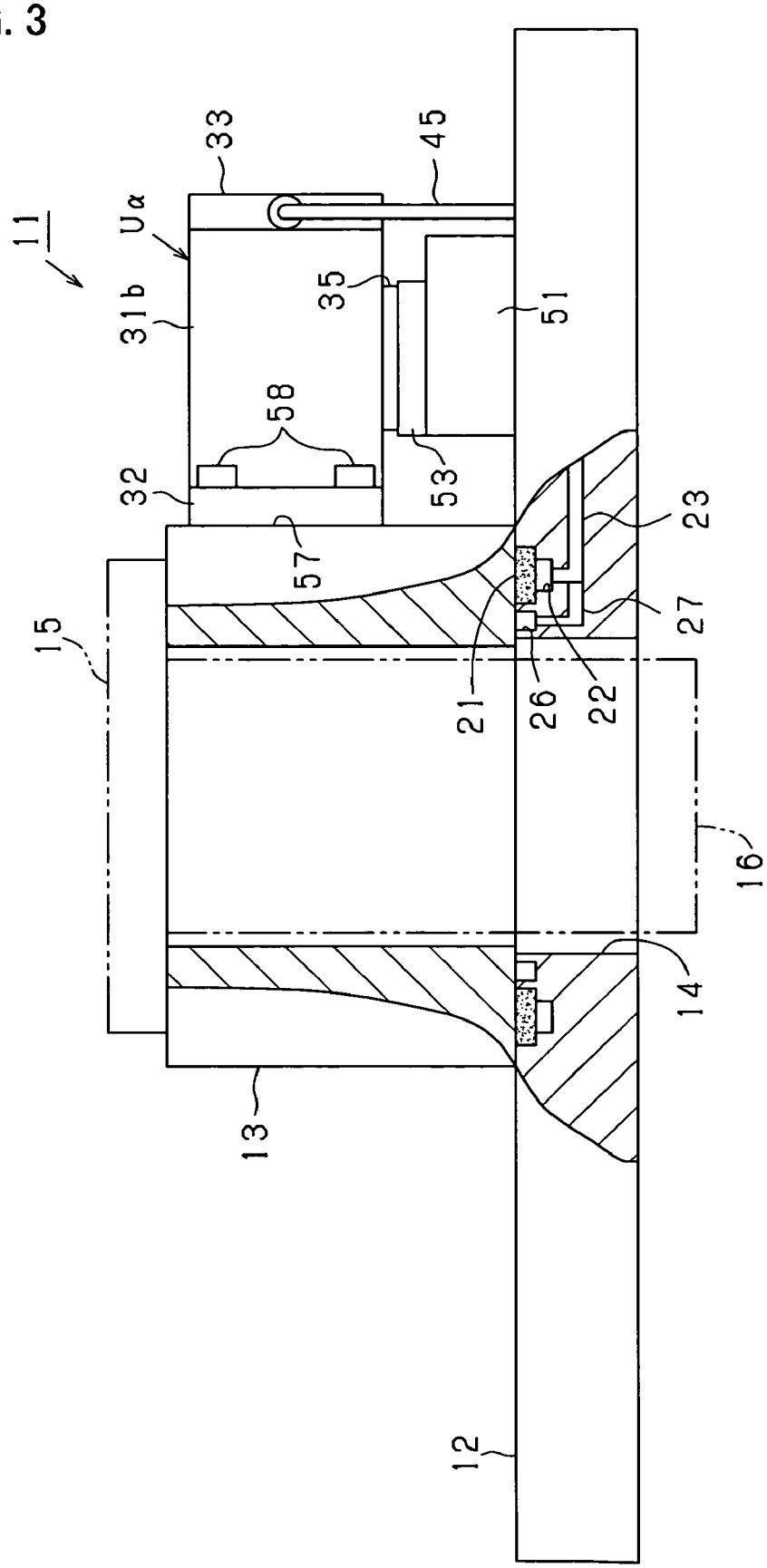
FIG. 3 is a partially broken-out front view of the moving table device in the embodiment
Figure 4:
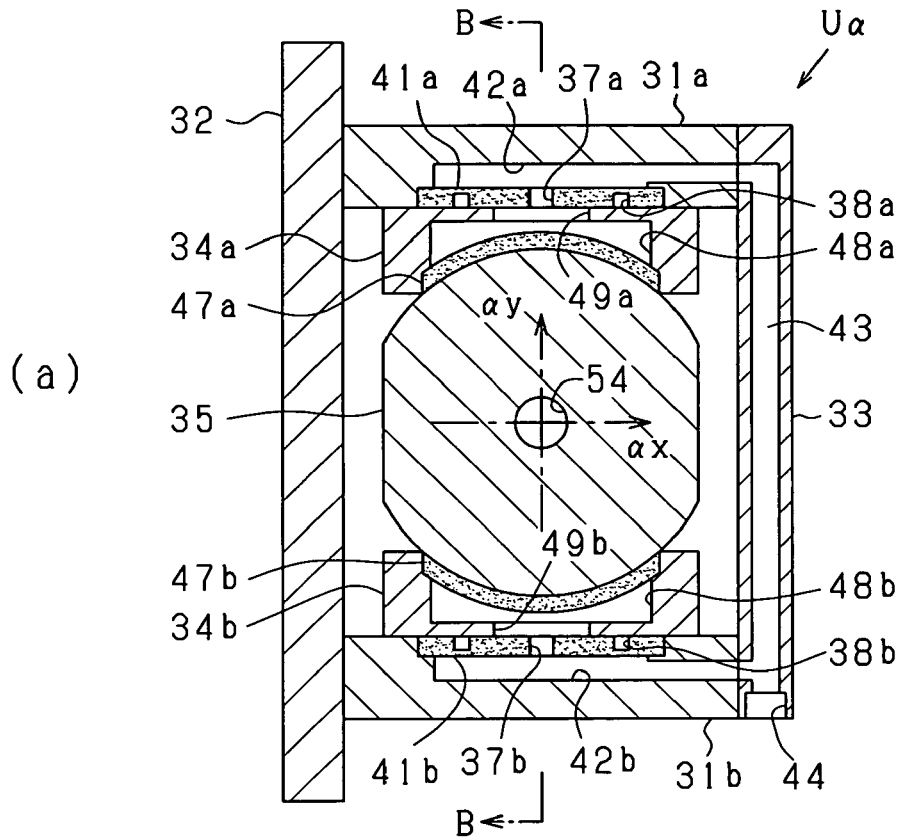
FIG. 4 is a diagram showing a cross section along line A-A in FIG. 2.
Figure 4:
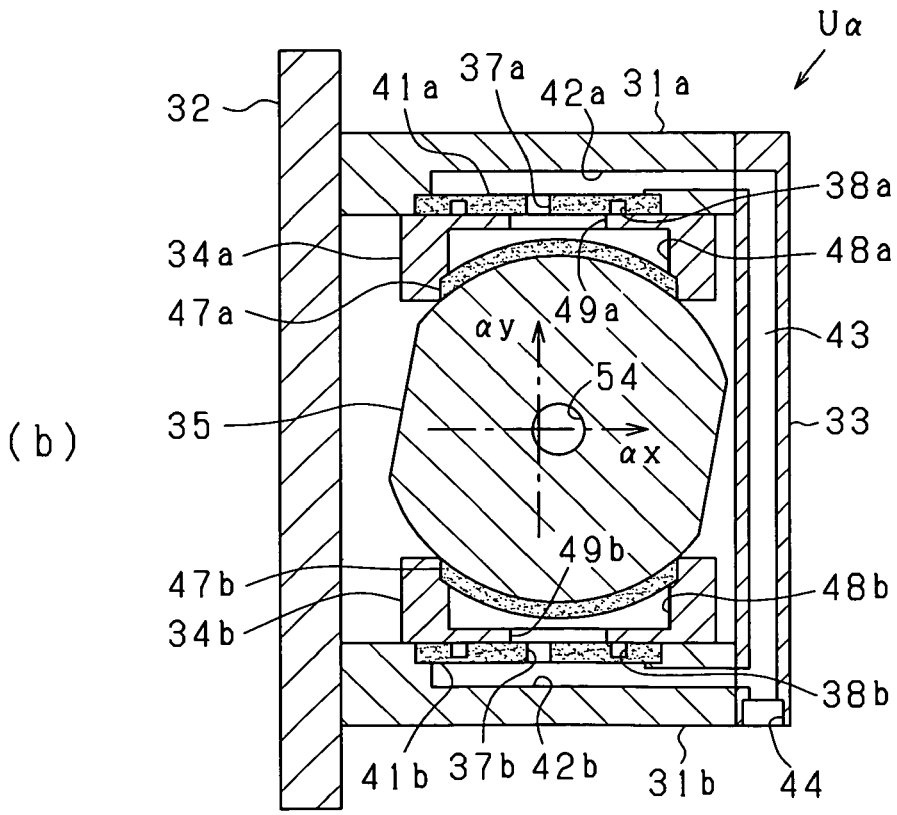
Figure 5:
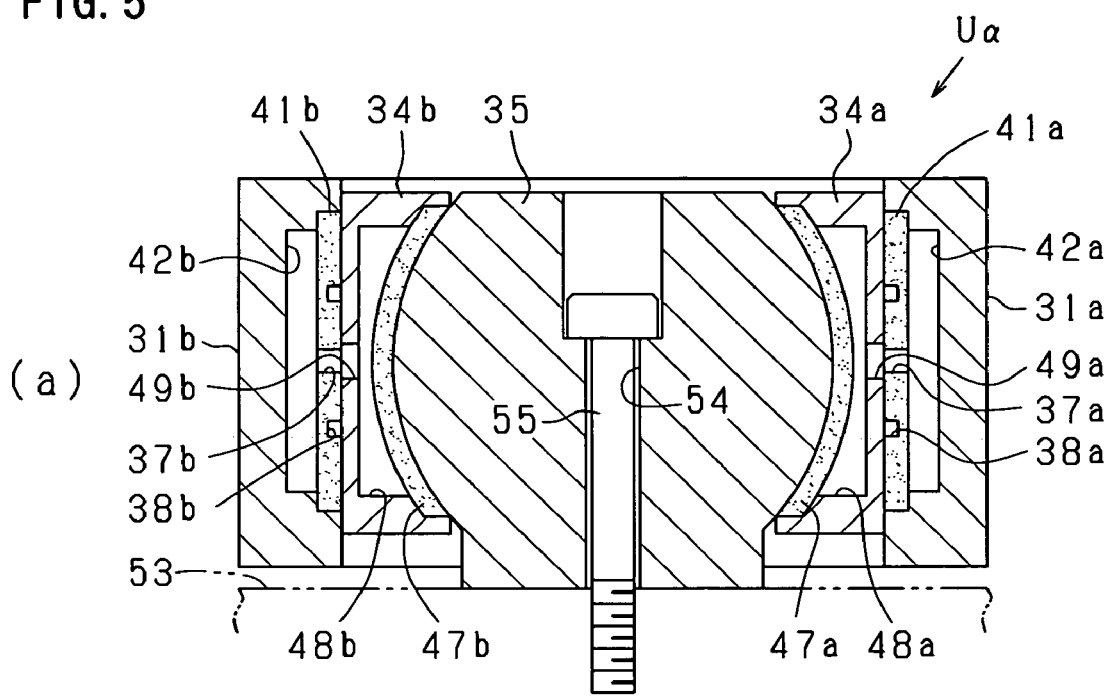
FIG. 5 is a diagram showing a cross section along line B-B in FIG. 4.
Figure 5:
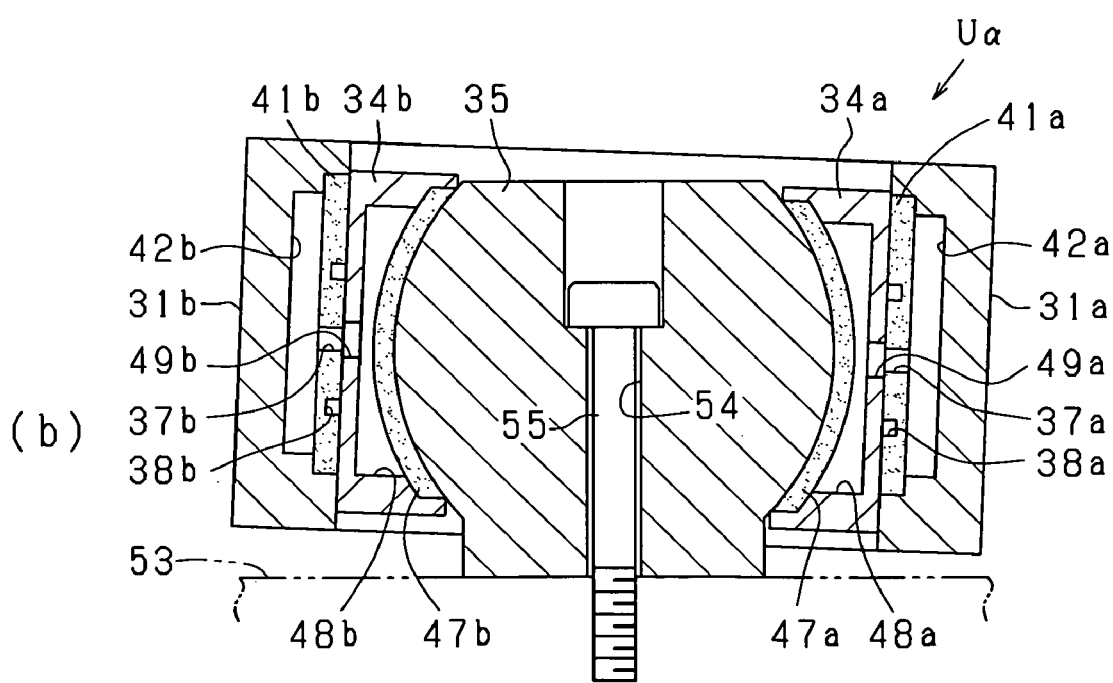

An embodiment of the present teaching is explained below, referring to FIGS. 1 through 5. Note that FIG. 1 is a plan view of a moving table device 11; FIG. 2 is a side view of the moving table device 11; FIG. 3 is a partially broken-out front view of the moving table device 11 (with both FIGS. 2 and 3 showing only a single supporting unit, i.e., Uα); FIG. 4 is a diagram showing a cross section along line A-A in FIG. 2; and FIG. 5 is a diagram showing a cross section along line B-B in FIG. 4.

The moving table device 11 is used for moving and rotating a table 13, relative to a base 12 in three axial directions (X, Y, and θ). Note that the X-Y plane is a virtual plane along the top surface of the base 12, and the θ direction is a rotational direction around the Z axis, which is orthogonal to the X-Y plane. In the present embodiment, a center hole 14 that goes through the base 12 in the vertical direction has been formed. The table 13 has been formed into a cylindrical shape, and its internal space communicates with the center hole 14. A jig 15 is installed on the table 13 as indicated by the two-dot-chain line in FIG. 3, and the bottom edge position of the jig 15 is set as a manufacturing part 16. The manufacturing part 16, for example, can hold a certain part or can be equipped with a certain instrument as needed.

As shown in FIG. 3, a ring-shaped porous plate 21 that consists of a porous material is embedded in the top surface of the base 12 in a position so as to surround the center hole 14. The ring-shaped porous plate 21 can be made of a metallic material, such as sintered aluminum, sintered copper, or sintered stainless steel; a synthetic resin material, such as sintered trifluoride resin, sintered tetrafluoride resin, sintered nylon resin, or sintered polyacetal resin; a sintered carbon; a sintered ceramic. The same holds true of the various porous members explained below in this Specification.

A flow-through groove 22 is formed on the back side of the ring-shaped porous plate 21, and a first flow channel 23 is formed to communicate with the flow-through groove 22. The first flow channel 23 also communicates with a first port 24 formed on one side surface of the base 12. Various formats are possible for the first port 24, which can be formed as, for example, a female screw hole in which a female screw has been formed for connecting a pipe, or can be provided with a one-touch joint. The same holds true of the various ports explained below in this Specification.

The first port 24 is connected to a pipe from a pressure supply/withdrawal source (not shown in the figure). Thus, when a compressed gas such as compressed air is supplied from the pressure supply/withdrawal source, this compressed gas is emitted from the surface of the ring-shaped porous plate 21, i.e., from its entire top surface, via the first port 24, the first flow channel 23, and the flow-through groove 22. As a result, the table 13 is supported by the gas and is kept out of contact with the base. Moving and rotating the table 13 in the X, Y, and θ directions in this non-contact state then achieve the positional adjustment. On the other hand, when the compressed gas is withdrawn by the pressure supply/withdrawal source, the gas present on the surface of the ring-shaped porous plate 21 is withdrawn, via the flow-through groove 22; the first flow channel 23; and the first port 24. As a result, the table 13 is held in its current position on the base 12. This holding prevents the table 13 from becoming unstable while work is being performed at the manufacturing part 16 after the positional adjustment by moving and rotating the table 13 in the X Y, and θ directions.

In the top surface of the base 12, an annular groove 26 is formed in a position so as to surround the center hole 14. This annular groove 26 is formed inside the internal perimeter of the ring-shaped porous plate 21 and opens toward the top. Additionally, a second flow channel 27 is formed to communicate with the bottom surface of the annular groove 26 and to communicate with a second port 28 formed on one side surface of the base 12.

A pipe from a vacuum source (not shown in the figure) is connected to the second port 28. Thus, gases, such as air, that are present above the annular groove 26 are suctioned off by the suction force from the vacuum source via the second flow channel 27 and the second port 28. As a result, whereas the emission of a compressed gas from the ring-shaped porous plate 21 tends to make the table 13 levitate unstably, the gas suction from the annular groove 26 increases the bearing rigidity, thus the table 13 is kept stable being out of contact with the base 12. Furthermore, since the gas suction occurs inside the internal perimeter of the ring-shaped porous plate 21, the compressed gas emitted from the ring-shaped porous plate 21 is completely or partially prevented from reaching the manufacturing part 16. As a result, the flow of the compressed gas will not adversely affect the object, such as a semiconductor, that is being worked on.

Multiple supporting units Uα, Uβ, and Uγ are provided on the base 12 and table 13. That is, multiple supporting units Uα, Uβ, and Uγ are provided on the outer perimeter side of the table 13 in a concentric circle whose center is the center of the center hole 14. The present embodiment uses three supporting units Uα, Uβ, and Uγ, which are positioned on the concentric circle at 120-degree intervals. These supporting units Uα, Uβ, and Uγ are provided in order to move and rotate the table 13 relative to the base 12 in the X, Y, and θ directions. Using α, β, and γ to respectively denote the local coordinate systems for the individual supporting units Uα, Uβ, and Uγ, the supporting unit Uα, for example, is positioned such that the horizontal axis αx is in the normal direction and the vertical axis αy is in the tangential direction of the concentric circle. The other supporting units Uβ and Uγ are positioned in the same manner. Since the individual supporting units Uα, Uβ, and Uγ have the same configuration, their configuration will be explained below mainly using the supporting unit Uα positioned on the right side of FIG. 1.

The supporting unit Uα is provided with a pair of planar bearing plates 31a and 31b positioned parallel to each other, an installation plate 32 positioned along the ends of the two planar bearing plates 31a and 31b, and a supporting plate 33 positioned along the opposite ends of the two planar bearing plates 31a and 31b. The ends of these plates 31 through 33 are then bolted together such that these plates are assembled together to form a frame. The frame has been formed into a rectangular shape in which the two planar bearing plates 31a and 31b are parallel to each other, and the installation plate 32 and the supporting plate 33 are parallel to each other.

Inside the rectangular frame, spherical bearing plates 34a and 34b are respectively positioned inside the planar bearing plates 31a and 31b. The facing surfaces of the planar bearing plates 31a and 31b and of the spherical bearing plates 34a and 34b are flat. Additionally, the spherical bearing plates 34a and 34b have a narrower width and a shorter height than the planar bearing plates 31a and 31b inside the rectangular frame. Therefore, the spherical bearing plates 34a and 34b respectively move relative to and along the flat surfaces of the planar bearing plates 31a and 31b.

Inside the rectangular frame, a spherical axial member 35 is positioned inside the spherical bearing plates 34a and 34b to be sandwiched between the two spherical bearing plates 34a and 34b. The facing surfaces of the spherical bearing plates 34a and 34b and of the spherical axial member 35 are made into spheres having the same curvature. Thus, the spherical axial member 35 can relatively rotate along the spherical surfaces of the spherical bearing plates 34a and 34b.

Planar porous plates 41a and 41b, which are comprised of a porous material and whose surfaces are flat, are respectively embedded in the facing surfaces of the two planar bearing plates 31a and 31b. Through holes 37a and 37b, which respectively penetrate the planar porous plates 41a and 41b in the front-to-back direction, are formed in the approximate centers of the planar porous plates 41a and 41b; and ring-shaped partitioning grooves 38a and 38b are formed on the front sides of the planar porous plates 41a and 41b in a position so as to surround the through holes 37a and 37b. Flow-through depressions 42a and 42b are respectively formed on the back sides of the planar porous plates 41a and 41b. A common, third flow channel 43, which communicates with both the flow-through depressions 42a and 42b, is formed in both the planar bearing plates 31a and 31b and the supporting plate 33. The third flow channel 43 communicates with a third port 44, which is formed on one side of the supporting plate 33.

One end of a pipe 45 is connected to the third port 44, and the other end of the pipe 45 is connected to the topside of the base 12. A fourth port 46, which communicates with the pipe 45 via a flow channel (not shown in the figure), is formed on the base 12. Note that the supporting units Uα, Uβ, and Uγ are each provided with a fourth port 46. A pipe from a pressure supply source (not shown in the figure) is connected to each fourth port 46.

Thus, when a compressed gas such as air is supplied from the pressure supply source, this gas is emitted from the entire surface of both the planar porous plates 41a and 41b, via the fourth port 46, the flow channel inside the base 12, the pipe 45, the third port 44, the third flow channel 43, and the flow-through depressions 42a and 42b. Here, since the through holes 37a and 37b eliminate the pressure difference between the front and back surfaces of the planar porous plates 41a and 41b, no static pressure will occur between the planar porous plates 41a and 41b and the spherical bearing plates 34a and 34b. However, in the present embodiment, the partitioning grooves 38a and 38b have been formed to surround the through holes 37a and 37b as described above. Therefore, by releasing the pressure through an emission groove (not shown in the figure) that communicates with the partitioning grooves 38a and 38b, the pressure difference between the front and back sides of the partitioning grooves 38a and 38b increases outside their outer perimeters, generating a static pressure. As a result, the spherical bearing plates 34a and 34b are supported by the static pressure and are kept out of contact with the planar bearing plates 31a and 31b.

Spherical porous plates 47a and 47b, which are comprised of a porous material and whose surfaces are spherical, are respectively embedded in the facing surfaces of the two spherical bearing plates 34a and 34b. Flow-through depressions 48a and 48b are respectively formed on the back sides of both of the spherical porous plates 47a and 47b. Flow-through holes 49a and 49b, which link the flow-through depressions 48a and 48b to the planar porous plates 47a and 47b, are respectively formed on the bottom sides of both of the flow-through depressions 48a and 48b. The flow-through holes 49a and 49b communicate with the through holes 37a and 37b of the planar porous plates 41a and 41b. Therefore, the compressed gas supplied from the through holes 37a and 37b of the planar porous plates 41a and 41b is emitted from the entire surface of both the spherical porous plates 47a and 47b via the flow-through holes 49a and 49b and the flow-through depressions 48a and 48b. As a result, the spherical axial member 35 is supported by the gas and is kept out of contact with the spherical bearing plates 34a and 34b.

A linear actuator 51, which extends in the αy direction, is provided on the base 12. The linear actuator 51 is provided with a guide rail 52 that is fixed with fixing tools such as bolts, to the base 12; a slider 53 that slides along this guide rail 52; and a driver (not shown in the figure) that drives the slider 53. The driver is comprised of, for example, a linear motor, and is controlled by a controller (not shown in the figure). Since the linear actuator 51 is fixed to the base 12, the wiring to the driver is not affected by the operation of the supporting unit Uα. The spherical axial member 35 is fixed to the slider 53. That is, a bolt hole 54 is formed through the center of the spherical axial member in the vertical direction, and a bolt 55 inserted through this bolt hole 54 fixes the spherical axial member 35 to the slider 53.

A flat installation surface 57 is formed on the table 13 where the supporting unit Uα is to be installed, and the installation plate 32 is fixed to the flat installation surface 57. That is, the flat installation surface 57 is formed to be slightly larger than the installation plate 32 when viewed from the front, and the installation plate 32 is fixed on the flat installation surface 57 with bolts 58, being positioned within the plane of the flat installation surface 57.

The other supporting units Uβ and Uγ have the same configuration as the supporting unit Uα explained above, and only their installation positions and installation directions differ from those described above.

Now, in the moving table device 11 thus configured, to make positional adjustment for the table 13 in the X Y, and θ directions, a compressed gas is first supplied from the pressure supply/withdrawal source connected to the first port 24. The table is then levitated above the base 12. At the same time, a suction force is generated by the vacuum source connected to the second port 28, pulling the table 13 toward the base 12. As a result, the table 13 is supported with an increased level of bearing rigidity, being kept out of contact with the base 12. Consequently, the table 13 can be stabilized, and the load present during the positional adjustment of the table 13 by the individual supporting units Uα, Uβ, and Uγ can be reduced.

Next, from this state, the linear actuators 51 of the individual supporting units Uα, Uβ, and Uγ are activated by determined magnitudes Δαy, Δβy, and Δγy. As a result, the magnitudes of the shifts of the table 13 in the X, Y, and θ directions are uniquely determined by these activation magnitudes Δαy, Δβy, and Δγy. Thus, the position of the table 13 is adjusted. During positional adjustment in the supporting unit Uα, for example, the planar bearing plates 31a and 31b are slid relative to the spherical bearing plates 34a and 34b in the αx direction, or another part is rotated relative to the spherical axial member 35 in the αθ direction, as shown in FIG. 4(b).

Furthermore, during this positional adjustment, the compressed gas is constantly supplied from each fourth port 46. This ensures the smooth sliding movements between the planar bearing plates 31a and 31b and the spherical bearing plates 34a and 34b, and the smooth rotational movements between the spherical bearing plates 34a and 34b and the spherical axial member 35.

After the positional adjustment, the gas is suctioned off by the pressure supply/withdrawal source connected to the first port 24. Thus, the table 13 is held on the base 12. Holding the table 13 in this contacted state prevents it from becoming unstable during the performance of work at the manufacturing part 16 that follows the adjustments for the table 13 in the X Y, and θ directions. Note that since a force for suctioning the table 13 is constantly being applied from the second port 28, simply stopping the supply of the compressed gas and releasing it to the atmosphere is sufficient to hold the table 13 in the contacted state, without actively suctioning off the gas from the first port 24.

In the supporting unit Uα explained above, between the planar bearing plates 31a and 31b, the spherical bearing plates 34a and 34b can move in the αx and αz directions and the spherical axial member 35 can rotate in all rotational directions around the αx, αy, and αz axes. That is, the gap between the planar bearing plates 31a and 31b is constant and only the movement in the αy direction is restricted by the linear actuator 51, resulting in the movability along the five axes out of the six axes. As a result, linking the supporting unit Uα to the base 12 and to the table 13 becomes extremely easy. That is, with a conventional supporting unit, unless the individual axes are orthogonal to each other, the unit cannot be correctly installed and the bearing may be deformed. The present embodiment eliminates such problems. For example, the supporting unit Uα can be linked even if it is tilted as shown in FIG. 5 (b).

Furthermore, in the supporting unit Uα, the spherical bearing plates 34a and 34b and the spherical axial member 35 can be installed without first being correctly positioned in the αx direction between the two planar bearing plates 31a and 31b. This further simplifies the assembly operation for the supporting unit Uα.

Moreover, the supporting units Uα, Uβ, and Uγ do not directly support the load from the table 13. Instead, the load is supported by a thrust bearing provided on the base 12, that is, so-called static-pressure bearing created by the compressed gas being emitted from the ring-shaped porous plate 21, which keeps the table 13 out of contact with the base 12. This results in high support rigidity for the table 13. Furthermore, it is possible to hold the table 13 on the base 12 by suctioning off the gas from its surface via the ring-shaped porous plate 21. As a result, problems such as vibration while work is being performed at the manufacturing part 16 are prevented, allowing highly accurate operations.

Note that the application of the present teaching is not limited to the embodiment explained above, and can for example be implemented in other embodiments explained below.

(a) In the aforementioned embodiment, the planar porous plates 41a and 41b are provided in the planar bearing plates 31a and 31b and the spherical porous plates 47a and 47b are provided in the spherical bearing plates 34a and 34b. However, it is also possible to provide the planar porous plates 41a and 41b in the spherical bearing plates 34a and 34b. That is, it is possible to provide spherical porous plates 47a and 47b on the internal surface of the spherical bearing plates 34a and 34b and to provide the planar porous plates 41a and 41b on the external surface of the spherical bearing plates 34a and 34b.

In the aforementioned embodiment, when the spherical bearing plates 34a and 34b slide along the bearing surfaces of the planar bearing plates 31a and 31b, an offset might occur between the shaft of the spherical bearing and that of a planar bearing. This configuration might result in an offset load and reducing the bearing rigidity of the planar bearing in the direction that is orthogonal to the bearing surface (the αy direction in FIG. 4). In contrast, in the present embodiment, the spherical porous plates 47a and 47b and the planar porous plates 41a and 41b are all provided in the spherical bearing plates 34a and 34b. This configuration thus eliminates variation in the bearing rigidity induced by the load. Note that, for the same reason, it is also possible to modify the configuration of the bearings in the various embodiments explained below.

Figure 6:
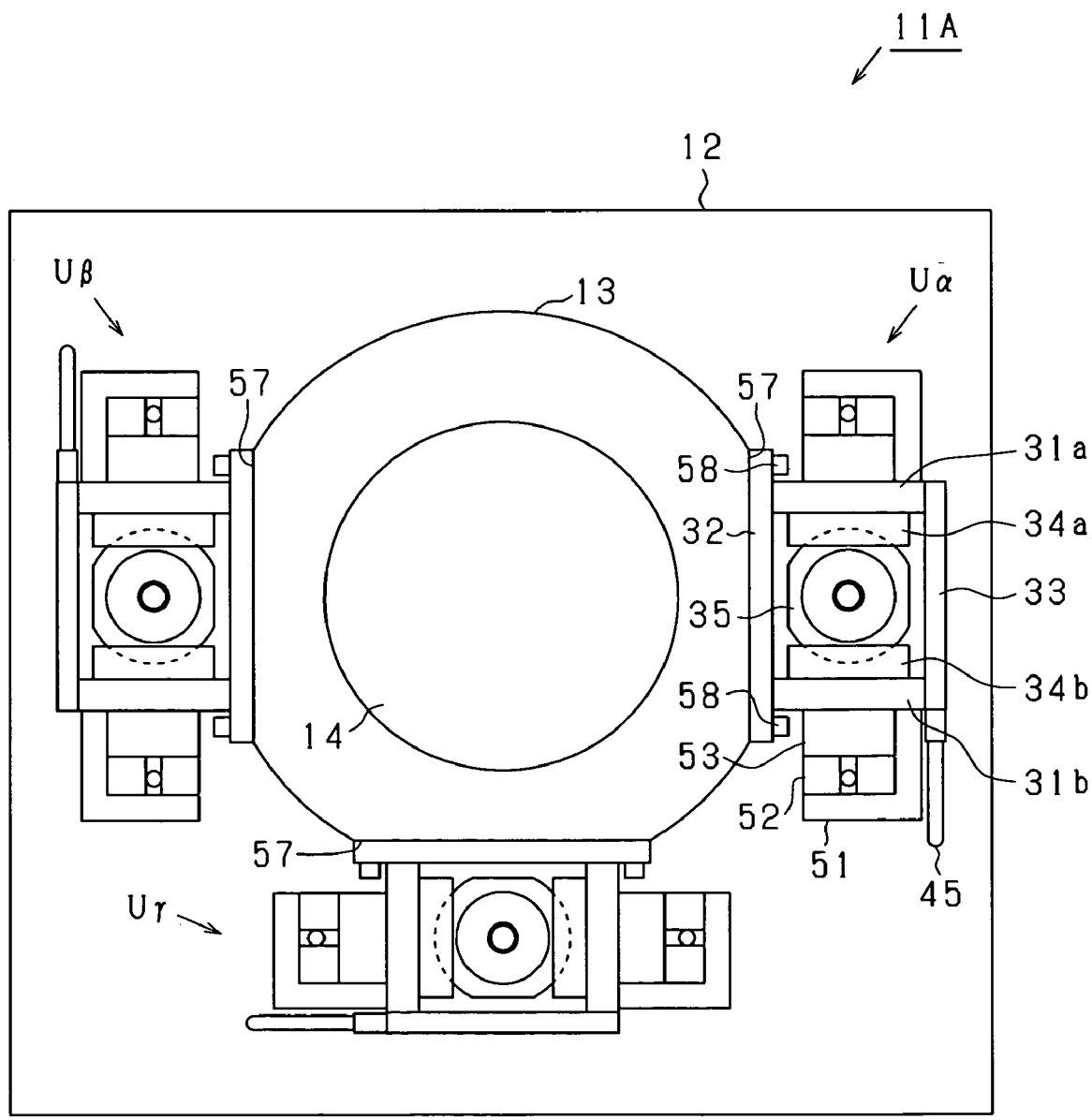
FIG. 6 is a plan view of a moving table device in another embodiment

(b) In a moving table device 11A shown in FIG. 6, the supporting units Uα, Uβ, and Uγ are positioned in the circumferential direction of the table 13 at 90-degree intervals. That is, the supporting units Uα and Uβ are positioned parallel to each other, and the supporting unit Uγ is positioned orthogonal to the other two. This configuration provides the benefit of simpler control during the positional adjustment of the table 13, compared to the case in which the individual supporting units Uα, Uβ, and Uγ are positioned at 120-degree intervals as mentioned above.

(c) In the first embodiment, the same compressed gas supply was used for the spherical bearing plates 34a and 34b and the planar bearing plates 31a and 31b. However, it is also possible to use a separate, dedicated pipe to supply the compressed gas to the spherical bearing plates 34a and 34b. In this case, it is preferable to use a thin, soft tube for the pipe in order not to hinder the movements of the spherical bearing plates 34a and 34b. Such a configuration eliminates the need for the through holes 37a and 37b and the partitioning grooves 38a and 38b formed in planar porous plates 41a and 41b. Further, this configuration eliminates the need for the flow-through holes 49a and 49b formed in the spherical bearing plates 34a and 34b, thereby simplifying the parts-processing step.

Figure 7:
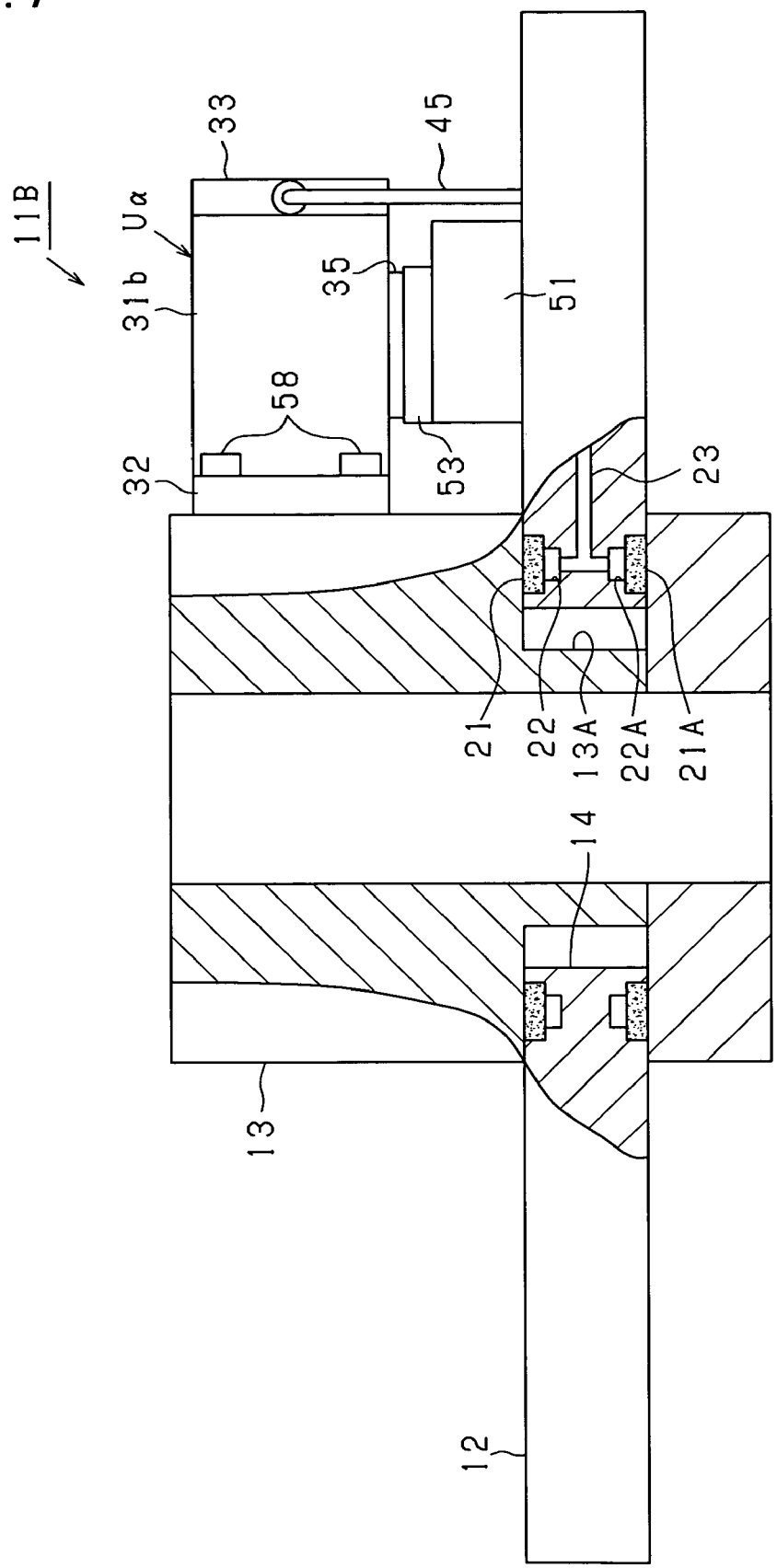
FIG. 7 is a partially broken-out front view of a moving table device in still another embodiment.

(d) In a moving table device 11B shown in FIG. 7, a groove 13A is formed in the table 13 (for purposes of installation, the table in this embodiment is comprised of separate top and bottom table members that are assembled together). The table 13 is fitted on the base 12, with a determined clearance left between the groove 13A and the perimeter of the center hole 14 of the base 12. Additionally, a ring-shaped porous plate 21A is fitted into the back side of the base 12, and a flow-through groove 22A, which communicates with the first flow channel 23, is formed on the back side of this ring-shaped porous plate 21A. This configuration can achieve a supporting strength that will counteract an offset load applied to the table 13, and allows the moving table device 11B to be used inverted if necessary. Another advantage is that sufficient bearing rigidity can be achieved even without the ring-shaped groove 26 for suctioning the gas in the first embodiment.

Figure 8:
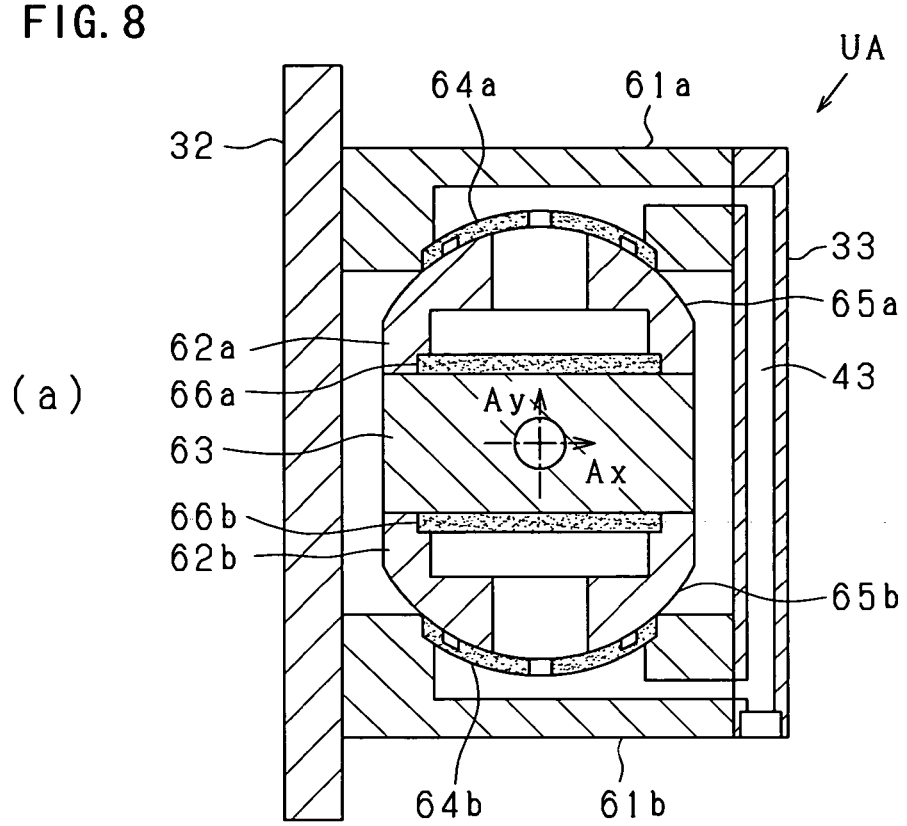
FIG. 8 is a cross-sectional diagram of a supporting unit in another embodiment.
Figure 8:
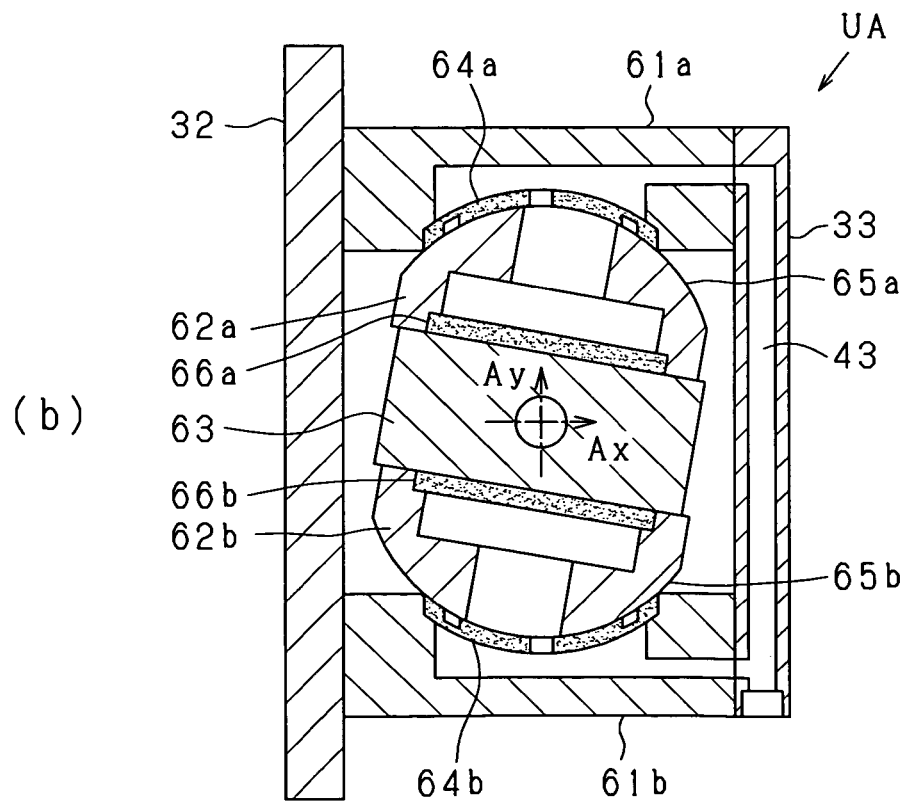

(e) In a supporting unit UA shown in FIG. 8, the sequence in which the bearings are arranged is different from that in the first embodiment. That is, starting from the outside, spherical bearing plates 61a and 61b, planar bearing plates 62a and 62b, and a polygonal shaft 63 are provided in that order. Spherical porous plates 64a and 64b are embedded in the facing surfaces of the spherical bearing plates 61a and 61b. The spherical porous plates 64a and 64b support spherical parts 65a and 65b of the planar bearing plates 62a and 62b so that spherical parts 65a and 65b can rotate being out of contact with the spherical bearing plates 61a and 61b. Planar porous bearing plates 66a and 66b are embedded in the facing surfaces of the planar bearing plates 62a and 62b. The planar porous bearing plates 66a and 66b support the polygonal shaft 63 so that it can move along the facing surfaces being out of contact with the planar bearing plates 62a and 62b. Configurations of other parts such as the flow channel are basically the same as that used in the first embodiment, and explanations of them are omitted here. Note that FIG. 8 (b) shows the state in which the planar bearing plates 62a and 62b and the polygonal shaft 63 have rotated from their initial states shown in FIG. 8 (a). This configuration produces the same effects as those produced in the first embodiment (f) In the first embodiment, each of the supporting units Uα, Uβ, and Uγ has a configuration in which the spherical bearing plates 34a and 34b and the spherical axial member 35 can vertically fall through the rectangular frame assembled together from the planar bearing plates 31a and 31b, the installation plate 32, and the supporting plate 33. Therefore, to prevent a fall-through, it is acceptable to provide the supporting units Uα, Uβ, and Uγ with stoppers. For example, it is possible to use stoppers protruding from the areas of the facing surfaces of the planar bearing plates 31a and 31b that are close to the top and bottom edges of the spherical bearing plates 34a and 34b.

(g) Instead of using three supporting units, namely Uα, Uβ, and Uγ, it is also possible to use four supporting units. Furthermore, it is also possible to use as the individual bearings, sliding bearings or rolling bearings instead of static pressure bearings that use porous plates 21, 41, and 47. Moreover, the linear actuator 51 is not limited to that described above and may have other configurations, such as one consisting of a ball screw and a nut.

Figure 9:
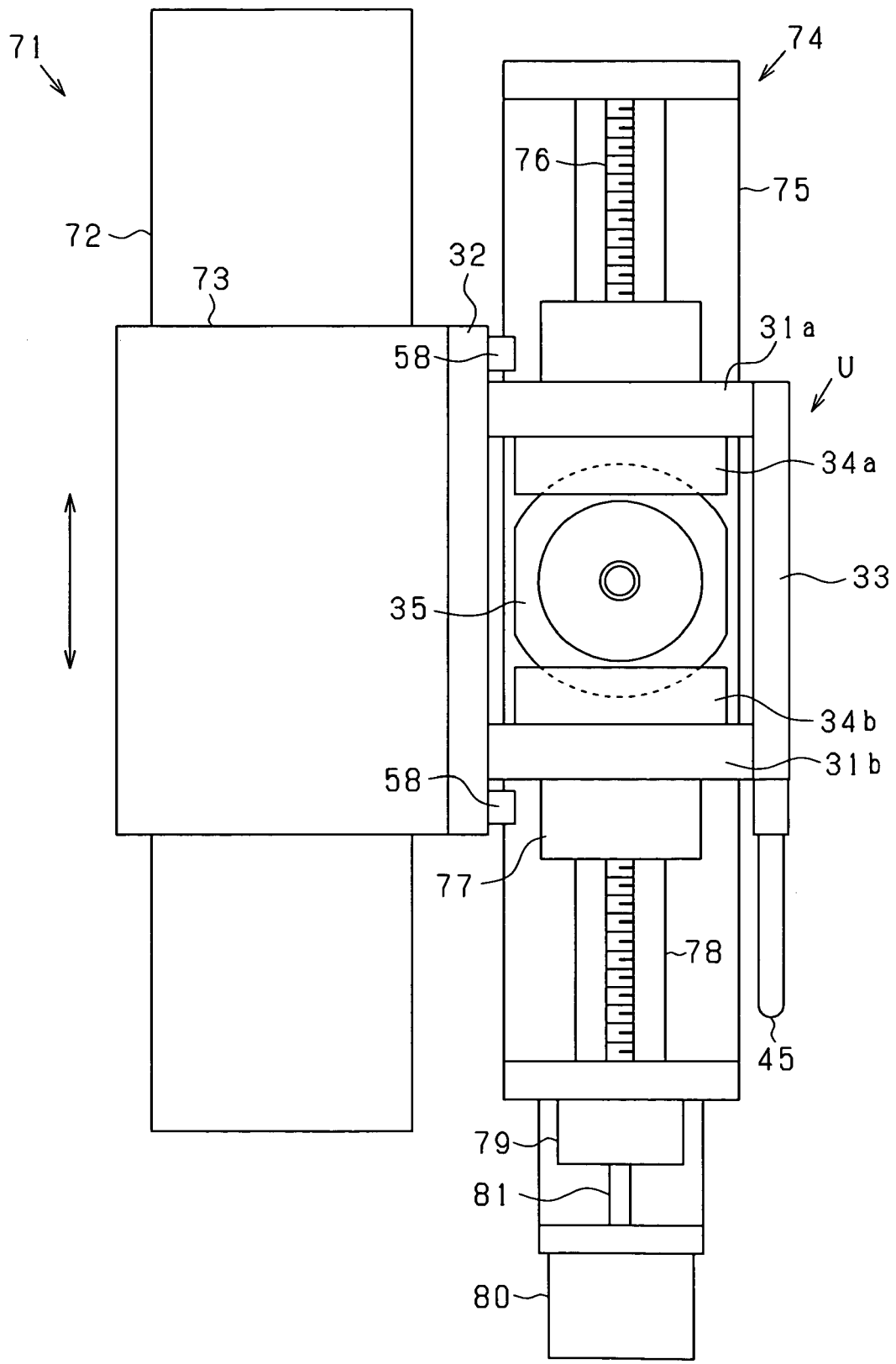
FIG. 9 is a plan view illustrating an example in which a supporting unit is applied to a linear-motion guiding device.

(h) As shown in FIG. 9, it is possible to apply the supporting unit U to a joint for a linear-motion guiding device 71. That is, by providing a slider 73 on the outer perimeter of a guide block 72, which extends in one direction, and generating static pressure between them, the slider 73 is supported by the pressure and kept out of contact with the guide block 72. With this configuration, it is possible to move the slider 73 along the guide block 72 while maintaining a non-contact state. The movements of the slider 73 are accomplished by a drive mechanism 74, which is positioned adjacent to the guide block 72.

The drive mechanism 74 is provided with a support frame 75 that is positioned nearly in parallel to the guide block 72, a ball screw 76 that is rotatably supported at both longitudinal ends of the support frame 75, a ball nut 77 that can move in the axial direction of the ball screw 76 as the ball screw 76 turns, and a linear guide rail 78 that is provided on the bottom surface of the support frame 75 in order to stop the rotation of the ball nut 77. Furthermore, a motor 80 is fixed on the end of the support frame 75, and an output shaft 81 of the motor 80 is linked to the ball screw 76 via a coupling 79. Therefore, controlling the rotation of the motor 80 in the forward or reverse direction moves the ball nut 77 linearly along the linear guide rail 78.

The spherical axial member 35 of the supporting unit U is fixed to the ball nut 77, and the installation plate 32 of the supporting unit U is fixed to the slider 73 with the bolts 58. Therefore, as the ball nut 77 moves linearly, the slider 73 moves linearly along the guide block 72 in the direction of the arrow in the figure. Here, since the supporting unit U has the configuration explained in the first embodiment, even if the guide block 72 is not exactly parallel to the linear guide rail 78 (or the ball screw 76), the high degree of movability of the supporting unit U can absorb the error. This configuration thus simplifies the assembly and eliminates the risk of bearing deformation.

Note that, in this case, since the supporting unit U and the slider 73 move linearly together, it is also possible to use the supporting unit U to supply the compressed gas for generating static pressure between the slider 73 and the guide block 72.

Figure 10:
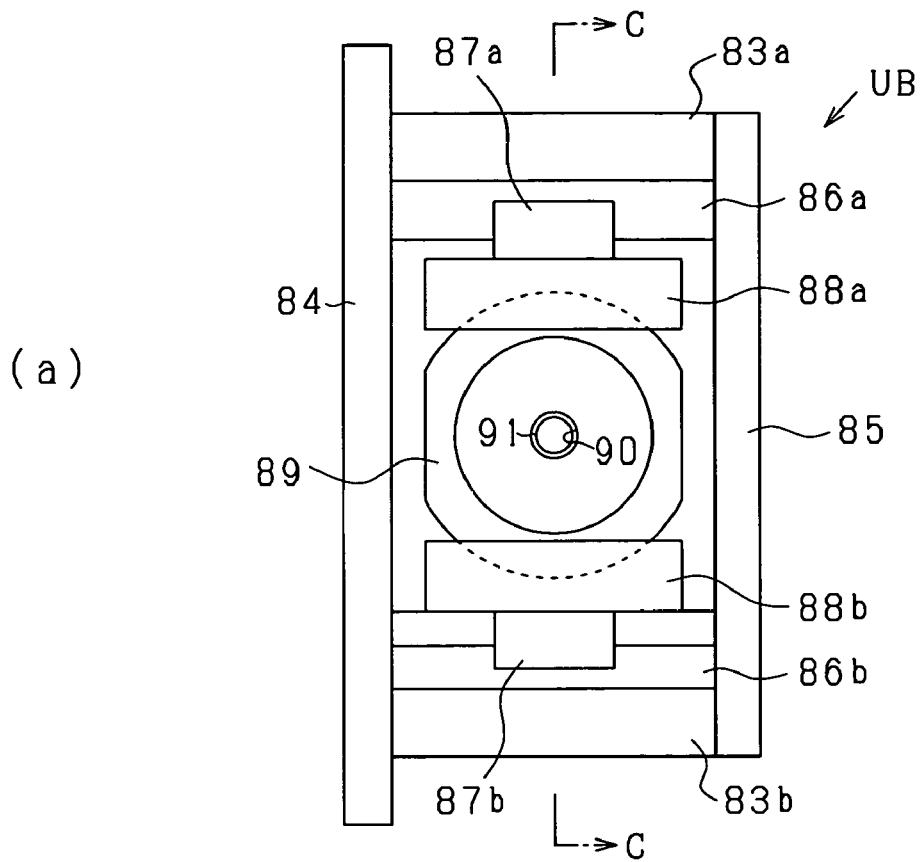
FIG. 10 shows a plan view of a supporting unit in another embodiment and a diagram showing a cross section along line C-C.
Figure 10:
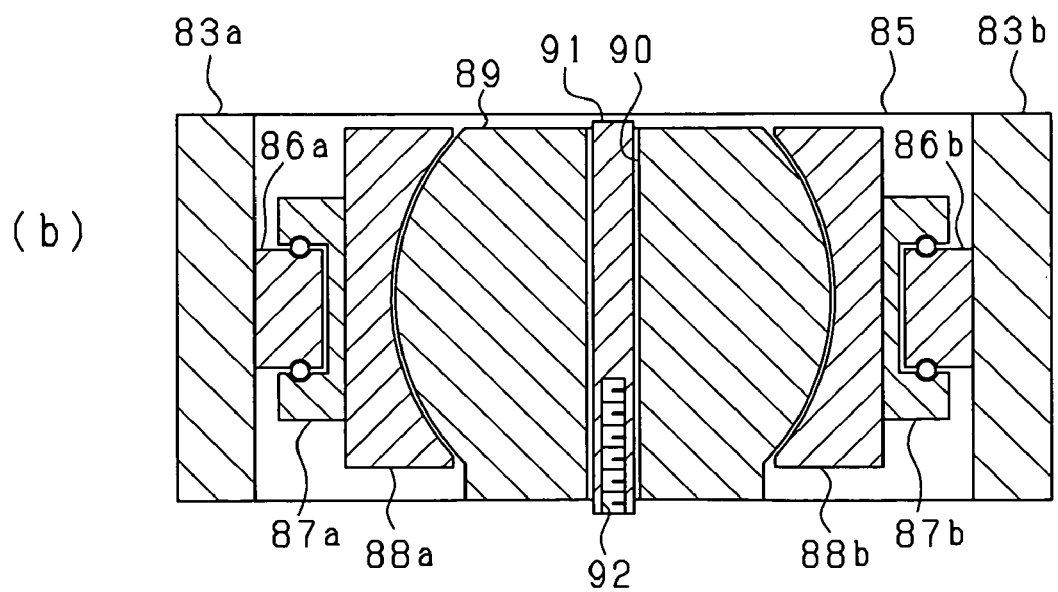

(i) A supporting unit UB shown in FIG. 10 is different from those in the first embodiments in that it does not use static pressure. That is, the supporting unit UB is provided with a pair of gap-maintaining plates 83a and 83b that are positioned parallel to each other, an installation plate 84 that is positioned at one end of the gap-maintaining plates 83a and 83b, and a supporting plate 85 that is positioned at the other end of the gap-maintaining plates 83a and 83b. The ends of these plates 83 through 85 are bolted together so that these plates 83 through 85 form a frame. The frame has a rectangular shape in which the two gap-maintaining plates 83a and 83b are parallel to each other, and the installation plate 84 and the supporting plate 85 are parallel to each other.

Inside the frame, guide rails 86a and 86b that extend in the lateral direction are fixed to the inside of the two gap-maintaining plates 83a and 83b. Furthermore, sliders 87a and 87b that respectively move in the lateral direction along the guide rails 86a and 86b are provided, and spherical bearing plates 88a and 88b are respectively provided in association with the sliders 87a and 87b. Therefore, the sliders 87a and 87b and the spherical bearing plates 88a and 88b can move in the lateral direction along and relative to the guide rails 86a and 86b.

Inside the frame, a spherical member 89 is sandwiched between and positioned on the inside of the spherical bearing plates 88a and 88b. The facing surfaces of the spherical bearing plates 88a and 88b and of the spherical member 89 are made into spherical surfaces having the same curvature. Thus, the spherical member 89 can rotate along and relative to the spherical surfaces of the spherical bearing plates 88a and 88b.

A through hole 90 is formed at the center of the spherical member 89 in the vertical direction, and an installation shaft 91 is inserted through the through hole 90. The installation shaft 91 can move inside and relative to the through hole 90 in its axial direction (vertical direction). A screw hole 92 is formed on the bottom of the installation shaft 91, and this screw hole 92 is open at its bottom end. Note that, though not shown in the figure, bearings for reducing sliding resistance, such as sliding bearings, rolling bearings are provided between the spherical bearing plates 88a and 88b and the spherical member 89, and between the through hole 90 and the installation shaft 91.

If the supporting unit UB thus configured is to be applied to, for example, the moving table device 11 in the first embodiment, the screw hole 92 is used to fix the installation shaft 91 to the base 12, and the installation plate 84 is fixed to the table 13. Then, the spherical member 89 can move in the vertical direction (the Z direction) relative to the installation shaft 91, the spherical bearing plates 88a and 88b can move in the rotational direction (the θ direction) relative to the spherical member 89, and the rectangular frame, which includes the gap-maintaining plates 83a and 83b, can move in the lateral direction (the X direction) relative to the spherical bearing plates 88a and 88b. As a result, the movability in the five-axial directions is ensured in the supporting unit UB in the same manner as in the first embodiment Furthermore, the present embodiment eliminates the need for generating static pressure and no compressed gas supply pipe is needed, and therefore, failures associated with a pile of pipes or damage can be avoided.

Note that in the present embodiment, the movability is ensured first in the vertical direction, and then in the rotational direction and the lateral direction, in that order, starting from the inside of the supporting unit UB. However, any order may be used. For example, it is easy to ensure the movability first in the lateral direction on the inside, then in the vertical direction on the outside, and finally in the rotational direction in the outermost position by simply changing the positions and shapes of the various parts. Moreover, the installation shaft 91 may have a prism shape instead of a circular cylinder shape.

The invention claimed is:

1. A supporting unit comprising:
   an axial member,
   a pair of first bearing members positioned to sandwich the axial member,
   a pair of second bearing members positioned external to the first bearing members so that the second bearing members sandwich the first bearing members,
   first bearings that support the axial member and are provided on the first bearing members, and
   second bearings that support the first bearing members,
   wherein both of the first bearings are configured as spherical bearings, and both of the second bearings are configured as planar bearings.

2. The supporting unit as set forth in claim 1,
   wherein a linking member is provided for linking together both of the second bearing members.

3. The supporting unit as set forth in claim 2,
   wherein a pair of the linking members are provided to form a frame shape using both of the second bearing members, and the first bearing bodies and the axial member are positioned inside said frame.

4. The supporting unit as set forth in claim 1,
   wherein both the first and second bearings are configured using static pressure bearings.

5. The supporting unit as set forth in claim 4,
wherein an induction port is provided in the first bearing member, the induction port inducing the compressed gas to be emitted from the second bearing into the first bearing.

6. The supporting unit as set forth in claim 1,
wherein the second bearings are provided on the second bearing members.

7. The supporting unit as set forth in claim 1,
wherein the second bearings are provided on the first bearing members.

8. A moving table device comprising:
a base,
three or more supporting units positioned at determined intervals on the base,
a plurality of linear actuators each of which is linked to the individual corresponding supporting unit, and
a table linked to the supporting units, the moving table device moves and rotates the table relative to the base by driving and controlling the linear actuators;
wherein the supporting units are configured with the supporting units described in claim 1, and
each supporting unit has an installation member, and the installation member of each supporting unit is linked to the table and the axial member of each supporting unit is linked to the linear actuator.

9. The moving table device as set forth in claim 8,
wherein the base is provided with a table bearing for supporting the load from the table.

10. The moving table device as set forth in claim 9,
wherein the table bearing is configured using a static pressure bearing, the table is kept out of contact with the base by supplying a compressed gas to the static pressure bearing, and the table is held on the base by suctioning off the gas via the static pressure bearing.

\* \* \* \* \*